United States Patent
Ye et al.

(10) Patent No.: US 11,085,986 B2
(45) Date of Patent: Aug. 10, 2021

(54) METHOD FOR REMOVING GHOST ARTIFACT OF ECHO PLANAR IMAGING BY USING NEURAL NETWORK AND APPARATUS THEREFOR

(71) Applicant: Korea Advanced Institute of Science and Technology, Daejeon (KR)

(72) Inventors: JongChul Ye, Daejeon (KR); Ju Young Lee, Daejeon (KR)

(73) Assignee: KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 0 days.

(21) Appl. No.: 16/549,500

(22) Filed: Aug. 23, 2019

(65) Prior Publication Data

US 2020/0072933 A1     Mar. 5, 2020

(51) Int. Cl.

| | |
|---|---|
| *G01V 3/00* | (2006.01) |
| *G01R 33/565* | (2006.01) |
| *G01R 33/56* | (2006.01) |
| *G06N 3/08* | (2006.01) |
| *G01R 33/561* | (2006.01) |

(52) U.S. Cl.
CPC ... *G01R 33/56509* (2013.01); *G01R 33/5608* (2013.01); *G01R 33/5615* (2013.01); *G01R 33/56554* (2013.01); *G06N 3/08* (2013.01)

(58) Field of Classification Search
CPC ............. G01R 33/543; G01R 33/5659; G01R 33/3415; G01R 33/36; A61B 5/055
USPC ....................................................... 324/309
See application file for complete search history.

(56) References Cited

U.S. PATENT DOCUMENTS

| | | | | |
|---|---|---|---|---|
| 2007/0286287 A1* | 12/2007 | Kim | ........................ | H04N 19/51 375/240.16 |
| 2008/0089570 A1* | 4/2008 | Weng | .................. | G01R 33/5616 382/131 |
| 2015/0077107 A1* | 3/2015 | Sharp | .................. | G01R 33/4625 324/309 |
| 2016/0267689 A1* | 9/2016 | Ye | ....................... | G01R 33/5611 |

OTHER PUBLICATIONS

Lee et al.,"k-Space Deep Learning for Reference-free EPI Ghost Correction", 2018, pp. 1-10.

* cited by examiner

*Primary Examiner* — Walter L Lindsay, Jr.
*Assistant Examiner* — Frederick Wenderoth
(74) *Attorney, Agent, or Firm* — Blank Rome LLP

(57) ABSTRACT

Disclosed herein are a method and an apparatus for removing ghost artifacts of an echo planner image using a neural network. An image processing method according to an embodiment of the inventive concept includes receiving Fourier space data of an echo planar image, and restoring the echo planar image in which ghost artifacts are removed using a neural network. The receiving of the Fourier space data may include dividing the Fourier space data into the odd-numbered Fourier space data and even-numbered Fourier space data, and the restoring of the echo planar image may include obtaining the odd-numbered Fourier space data and even-numbered Fourier space data with the Fourier space interpolated using the neural network and restoring the echo planar image in which the ghost artifacts are removed based on the odd-numbered Fourier space data and even-numbered Fourier space data with the Fourier space interpolated.

12 Claims, 9 Drawing Sheets

METHOD FOR REMOVING GHOST ARTIFACT OF ECHO PLANAR IMAGING BY USING NEURAL NETWORK AND APPARATUS THEREFOR

CROSS-REFERENCE TO RELATED APPLICATIONS

A claim for priority under 35 U.S.C. § 119 is made to Korean Patent Application No. 10-2018-0102146 filed on Aug. 29, 2018, in the Korean Intellectual Property Office, the entire contents of which are hereby incorporated by reference.

BACKGROUND

Embodiments of the inventive concept described herein relate to an electronic device, and more particularly, relate to a method and an apparatus for stably removing ghost artifacts of an echo planner image even when nonuniformity in a magnetic field is large by using a network.

Magnetic Resonance Imaging (MRI) is a technology that acquires images of the neural organs of a human body by collecting signals obtained by resonating elements arranged in a constant magnetic field with radio frequency (RF) pulses. A representative example of a method of obtaining magnetic resonance images at high speed is an Echo Planar Imaging (EPI) approach. The echo planner imaging approach may receive a magnetic resonance image from a single free induction decay (FID) signal for a period of time of 40 ms to 100 ms, thereby realizing an ultrafast imaging. Due to the fast scan of the echo planar imaging, artifacts caused by the movement of the target or problems of magnetic resonance imaging (MRI) may be reduced.

However, the echo planar imaging approach generates a large field gradient magnetic field and performs switching at a rate of about 1 kHz, so it is not easy to implement an image on hardware, and severe distortion of the image occurs due to the magnetic susceptibility of the target. In particular, in the echo planar imaging approach, unlike in other methods of reading data in a certain direction, the direction of reading even scan lines and odd-numbered scan lines data in a Fourier space is different, resulting in a phase difference between the lines. Due to this phase difference, ghost artifacts are caused in the image domain, which hinders proper analysis of the echo planar image, and therefore many methods to remove ghost artifacts have been studied.

Typically, before a restored image is obtained, a reference scan, which is a reference image, is obtained, and then a phase difference between an even-numbered scan line and an odd-numbered scan line in k-space is calculated to correct the phase difference of a target image. However, this method requires more images and takes long time. Therefore, when using this method, a method of obtaining only three scan lines in additional images and then performing correction is frequently used to solve the shortcoming of long processing time. However, even in such a case, the ghost artifacts may not be properly removed due to the sensitivity of coils in a magnetic resonance imaging apparatus.

In addition, there have been proposed, for example, a method of modifying a sequence for obtaining an echo planar image to obtain an image capable of offsetting ghost artifacts, or a method of obtaining a phase difference using entropy in the characteristics of the echo planar image itself, but there is an disadvantage that the ghost artifacts are not effectively offset. To solve this problem, using the fact that an annihilating filter exists in Fourier space, Fourier space data divided into even-numbered and odd-numbered scan-line images is composed of a block Hankel matrix, and the problem is transformed into a problem of a lack of rank. It was studied how to remove it. However, this method takes a long time because the amount of computation of the matrix is very large, and it is greatly affected by the field inhomogeneity because this method obtains the base component of the data itself and performs restoration.

SUMMARY

Embodiments of the inventive concept provide a method and an apparatus for removing ghost artifacts of an echo planar image, capable of stably removing ghost artifacts of an echo planar image even when nonuniformity in a magnetic field is large, by using a neural network.

According to an exemplary embodiment, an image processing method includes receiving Fourier space data of an echo planar image, and restoring the echo planar image in which ghost artifacts are removed using a neural network.

The receiving of the Fourier space data may include dividing the Fourier space data into the odd-numbered Fourier space data and even-numbered Fourier space data, and the restoring of the echo planar image may include obtaining the odd-numbered Fourier space data and even-numbered Fourier space data with the Fourier space interpolated using the neural network and restoring the echo planar image in which the ghost artifacts are removed based on the odd-numbered Fourier space data and even-numbered Fourier space data with the Fourier space interpolated.

The restoring of the echo planar image may include restoring the echo planar image in which the ghost artifacts are removed using the neural network satisfying a predetermined low-rank Hankel matrix constraint.

The neural network may include a neural network based on annihilating filter-based low-rank Hankel matrix approach (ALOHA) and deep convolution framelet.

The neural network may include a neural network based on convolution framelet.

The neural network may include a multi-resolution neural network including a pooling layer and an unpooling layer, and the neural network may include a bypass connection from the pooling layer to the unpooling layer.

According to an exemplary embodiment, an image processing method includes receiving Fourier space data of an echo planar image, and restoring the echo planar image in which ghost artifacts are removed using a neural network interpolating Fourier space based on low-rank Hankel matrix approach and convolution framelet.

The receiving of the Fourier space data may include dividing the Fourier space data into odd-numbered Fourier space data and even-numbered Fourier space data, and the restoring of the echo planar image may include obtaining the odd-numbered Fourier space data and even-numbered Fourier space data with the Fourier space interpolated using the neural network and restoring the echo planar image in which the ghost artifacts are removed based on the odd-numbered Fourier space data and even-numbered Fourier space data with the Fourier space interpolated.

According to an exemplary embodiment, an image processing apparatus includes a receiving unit configured to receive Fourier space data of an echo planar image, and a restoring unit configured to restore the echo planar image in which ghost artifacts are removed using a neural network interpolating Fourier space.

The receiving unit may divide the Fourier space data into odd-numbered Fourier space data and even-numbered Fourier space data, and the restoring unit may obtain the odd-numbered Fourier space data and even-numbered Fourier space data with the Fourier space interpolated using the neural network and restore the echo planar image in which the ghost artifacts are removed based on the odd-numbered Fourier space data and even-numbered Fourier space data with the Fourier space interpolated.

The restoring unit may remove ghost artifacts of the echo planar image using a neural network satisfying a predetermined low-rank Hankel matrix constraint.

The neural network may include a neural network based on annihilating filter-based low-rank Hankel matrix approach (ALOHA) and deep convolution framelet.

The neural network may include a neural network based on convolution framelet.

The neural network may include a multi-resolution neural network including a pooling layer and an unpooling layer.

The neural network may include a bypass connection from the pooling layer to the unpooling layer.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
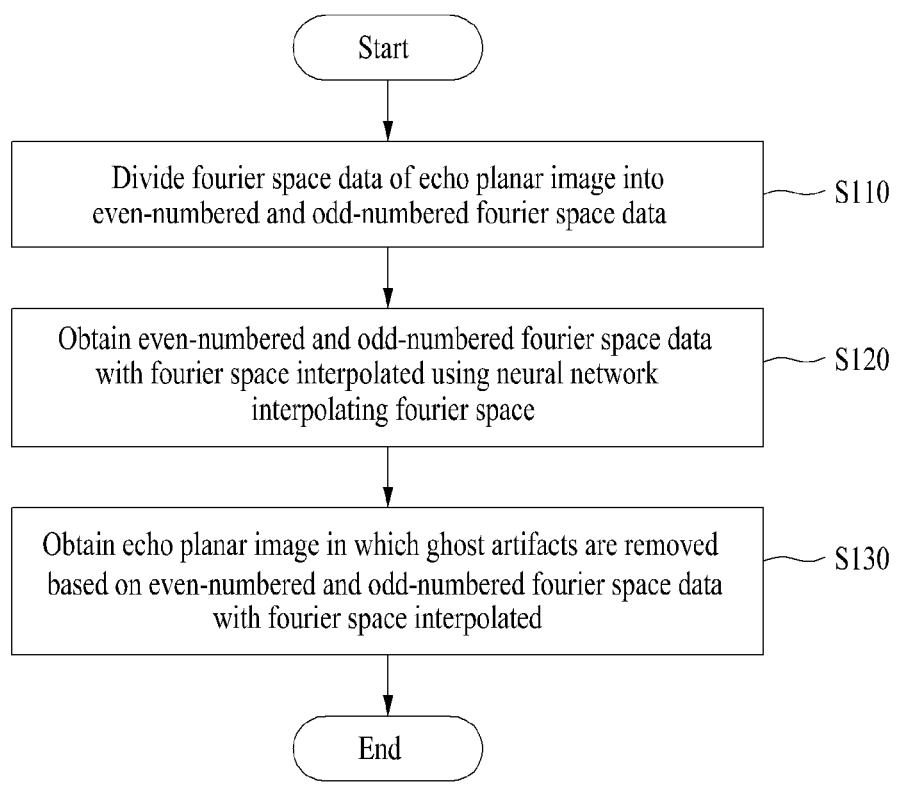
FIG. 1 is a flowchart illustrating a method of removing ghost artifacts of an echo planar image according to an embodiment of the inventive concept.

Advantages and features of the inventive concept and a method of achieving them will be clear by referring to embodiments described below in detail together with accompanying drawings. The inventive concept may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art. The inventive concept is only defined by the concept of claims.

The terminology used herein is for the purpose of describing embodiments only and is not intended to be limiting of the inventive concept. As used herein, the singular forms are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements thereof.

Unless otherwise defined, all terms (including technical and scientific terms) used herein have the same meaning as commonly understood by one of ordinary skill in the art to which this disclosure pertains. Terms used in generally, such as terms defined in a dictionary, shall not be construed in ideal or excessively formal meanings unless they are clearly defined in the inventive concept.

Hereinafter, exemplary embodiments of the inventive concept will be described in detail with reference to the accompanying drawings. The same reference numerals are used for the same components in the drawings, and duplicate descriptions of the same components are omitted.

There has been much research to remove ghost artifacts. One of the most widely used methods for removing ghost artifacts is the navigator-based method. In this method, a pre-scan, also referred to as a reference or navigator scan, is performed separately before the EPI scan to compensate for phase mismatch. The most common and simple method is to use k-space lines having no phase encoding gradient such that the phase difference between even and odd lines are capable of being calculated. Then, phase correction is performed on all phase encoding lines under the assumption that a phase offset changes linearly. However, in this method, the assumption that phase change is linear are not accurate for high field MR acquisition because of the complex and nonuniform changes in the field, in addition to additional acquisition time for the pre-scan on all image slices. Moreover, current functional MRI (fMRI) protocols initially acquire a reference scan only once, making it difficult to capture local field variations that change over time. To solve the ghost artifact problem caused by these nonlinear and time-varying local field changes, a navigator-free method has been proposed. Studies on pulse sequence modifications have shown a reduction in ghost artifacts. In addition, a navigator-free method without pulse sequence modification has also been studied, but such a classic navigator-free method is generally inefficient compared to a reference based method.

Recently, a high performance reference-free EPI ghost correction using a low rank Hankel matrix completion method has been proposed. For example, a technique using an annihilating filter-based low-rank Hankel matrix approach (ALOHA) means that even and odd k-space lines constituting a concatenated Hankel matrix has a low rank structure due to redundancy. Thus, the phase imbalance correction problem may be transformed into a missing k-space interpolation problem for even-numbered and odd-numbered k-space data, which may be solved using low rank Hankel matrix completion. This method may be easily extended to parallel multi-coil images by stacking Hankel matrices on each coil side by side and performing low rank Hankel matrix completion. However, one of the main limitations of this method is the computational complexity due to matrix factorization. Thus, a small annihilating filter size is often used to reduce computational complexity. However, this method may produce incorrect results in high-field MRI because this method cannot compensate for ghost artifacts in some fields.

Embodiments of the inventive concept stably remove the echo-planar image ghost artifacts even when unevenness in a magnetic field is large using a neural network to interpolate Fourier space. For example, the inventive concept may provide a technique capable of removing robust and calculable ghost artifacts suitable for high field MRI using a neural network.

Here, the inventive concept may correct ghost artifacts from a mathematical discovery that a neural network, for example, a CNN is closely related to Hankel matrix decomposition, and specifically, estimate a k-space line in which a k-space deep neural network is missed, similarly to ALOHA based ghost correction, by transforming ghost correction problem into even- and odd-numbered virtual k-space interpolation problem. In addition, the inventive concept may use redundancy between coils from parallel images by stacking multiple coil k-space data into multi-channel inputs.

Recently, the deep convolution framelet theory shows that an encoder-decoder network is derived from data-based low rank Hankel matrix decomposition, and the rank structure is controlled by the number of filter channels. This discovery provides important clues for developing successful deep learning approaches for k-space interpolation. In addition, all networks are implemented in the form of convolutional neural networks that do not require a fully connected layer, and the amount of requirement for a GPU memory may be minimized.

According to the theory of deep convolution framelets, the basis functions of these Hankel structure matrices may be decomposed into local basis functions and nonlocal basis functions, which function as convolution and pooling of neural networks. That is, the ALOHA approach may obtain the basis function of the Hankel structure matrix from the measured data, while the neural network obtains the basis function of the Hankel structure matrix through a learning process. In addition, the rectified linear unit (ReLU) function of the neural network restricts the values of the expansion coefficients of the basis to positive values, so that it can be seen that the basis function does not generate a new value that is not associated with the data, because pieces of training data are located in a conic hull of the base.

The neural network used in the inventive concept may include a convolution framelet-based neural network, a multi-resolution neural network including a pooling layer and an unpooling layer, a neural network satisfying a low-rank Hankel matrix constraint, a neural network satisfying a preset frame condition, and a neural network based on ALOHA and deep convolution framelet. Further, the multi-resolution neural network may include a bypass connection from the pooling layer to the unpooling layer.

The above-described convolution framelet is a method of expressing an input signal by using a local basis and a nonlocal basis, which will be described below.

The convolution framelet is expressed by using a local basis ($\psi_j$) and a non-local basis ($\phi_i$) with respect to the input signal f, and can be expressed by Equation 1 below.

[Equation 1]

$$f = \frac{1}{d}\sum_{i=1}^{n}\sum_{j=1}^{q}\langle f, \phi_i \circledast \psi_j\rangle \tilde{\phi}_i \circledast \tilde{\psi}_j \qquad \text{[Equation 1]}$$

Where, $\tilde{\phi}_i$ may denote a linear transform operation having a non-local basis vector, and $\tilde{\psi}_j$ may denote a linear transform operation having a local basis vector.

In this case, the local basis vector and the non-local basis vector may respectively have dual basis vectors $\tilde{\phi}_i$ and $\tilde{\psi}_j$ orthogonal to each other, and the orthogonal relation of the basis vectors may be defined as in Equation 2 below.

$$\Phi\Phi^T = \sum_{i=1}^{m}\tilde{\phi}_i\phi_i^T = I_{n\times n}, \Psi\Psi^T = \sum_{j=1}^{q}\psi_j\tilde{\psi}_j^T = I_{d\times d} \qquad \text{[Equation 2]}$$

Using Equation 2, the convolution framelet may be expressed as Equation 3 below.

$$\mathbb{H}_d(f) = \tilde{\Phi}\Phi^T\mathbb{H}_d(f)\Psi\tilde{\Psi}^T = \tilde{\Phi}C\tilde{\Psi}^T$$

$$C = \Phi^T\mathbb{H}_d(f)\Psi = \Phi^T(f\circledast\Psi) \qquad \text{[Equation 3]}$$

Where $\mathbb{H}_d$ denotes a Hankel matrix operator, which may mean a wrap-around Hankel matrix, and allows the convolution operation to be expressed by matrix multiplication. C denotes a convolution framelet coefficient, which is a signal converted by a local basis and a non-local basis.

The convolution framelet coefficient may be restored into the original signal by applying the dual basis vectors $\tilde{\phi}_i$, $\tilde{\psi}_j$. The signal restoration process may be expressed as Equation 4 below.

$$f = (\tilde{\Phi}C)\circledast\tau(\tilde{\Psi}) \qquad \text{[Equation 4]}$$

As described above, a method of expressing an input signal through the local and non-local basis is called convolution framelet.

ALOHA-Based Ghost Correction

Referring to the ALOHA based ghost correction, in the presence of off-resonance $\Delta f(x,y)$, the k-space measurement from the EPI sequence may be expressed as Equation 5 below.

$$\hat{g}(k_x, k_y) = \int\int\alpha(x, y)e^{i2\pi\left[\Delta f(x,y)\left((TE+(n-N/2)ESP)+(-1)^n\left(\frac{k_x}{\gamma G_x}\right)\right)\right]} \times \qquad \text{[Equation 5]}$$

$$e^{i2\pi(k_x x + k_y y)}dxdy$$

Where $i=\sqrt{-1}$ is given, and kx and ky directions denote read-out and phase-encoding respectively. n denotes a phase encoding index in an EPI echo train of total length N, $\alpha(x,y)$ denotes transverse magnetization, TE denotes echo time, and ESP may mean echo spacing, which is the time between echoes.

A key concept of ALOHA-based ghost correction is to divide an original equation into two sets of virtual k-space data, which may be represented as in Equation 6 below.

$$\hat{g}_+(k_x, k_y) = \int\int\alpha(x, y)e^{i2\pi\left[\Delta f(x,y)\left((TE+(n-N/2)ESP)+\left(\frac{k_x}{\gamma G_x}\right)\right)\right]} \times \qquad \text{[Equation 6]}$$

$$e^{i2\pi(k_x x + k_y y)}dxdy$$

$$= \int\int A(x, y)e^{i2\pi\Delta f(x,y)\frac{k_x}{\gamma G_x}}\cdot e^{i2\pi(k_x x + k_y y)}dxdy$$

$$\hat{g}_-(k_x, k_y) = \int\int\alpha(x, y)e^{i2\pi\left[\Delta f(x,y)\left((TE+(n-N/2)ESP)-\left(\frac{k_x}{\gamma G_x}\right)\right)\right]} \times$$

$$e^{i2\pi(k_x x + k_y y)}dxdy$$

$$= \int\int A(x, y)e^{-i2\pi\Delta f(x,y)\frac{k_x}{\gamma G_x}}\cdot e^{i2\pi(k_x x + k_y y)}dxdy$$

Where $A(x,y) = \alpha(x,y)e^{i2\pi\Delta f(x,y)(TE+(n-N/2)ESP)}$ may be given.

The even and odd echo signals from the actual EPI measurement may then be identified as ½-subsampled k-space data from $\hat{g}+(k_x,k_y)$ and $\hat{g}-(k_x,k_y)$ respectively.

Image content for even- and odd-numbered virtual data are respectively $$A(x,y)e^{+i2\pi\Delta f(x,y)\frac{k_x}{\gamma G_x}} \text{ and } A(x,y)e^{-i2\pi\Delta f(x,y)\frac{k_x}{\gamma G_x}}$$

different from each other. This difference is the main cause of Nyquist ghost artifacts, but since they differ only in phase, there is a significant overlap between the two ghost artifacts. Thus, ALOHA-based EPI correction uses this redundancy to interpolate missing virtual k-space data. More specifically, when two sets of virtual k-space data are subtracted, it may be expressed as Equation 7 below.

$$\hat{g}_\Delta(k_x, k_y) = \hat{g}_{n,+}(k_x, k_y) - \hat{g}_{n,-}(k_x, k_y) \quad \text{[Equation 7]}$$

$$= \int\int A(x,y)\left(e^{i2\pi\Delta f(x,y)\frac{k_x}{\gamma G_x}} - e^{-i2\pi\Delta f(x,y)\frac{k_x}{\gamma G_x}}\right)\times$$

$$e^{i2\pi(k_x x + k_y y)} dx dy$$

$$= \int\int A(x,y)2i\sin\left(2\pi\Delta f(x,y)\frac{k_x}{\gamma G_x}\right)$$

$$e^{i2\pi(k_x x + k_y y)} dx dy$$

Here, one of the most important observations is that when the off-resonance $\Delta f(x,y)$ is small enough, it may be expressed as Equation 8 below.

$$\sin\left(2\pi\Delta f(x,y)\frac{k_x}{\gamma G_x}\right) \simeq 2\pi\Delta f(x,y)\frac{k_x}{\gamma G_x} \quad \text{[Equation 8]}$$

Therefore, Equation 7 may be expressed as Equation 9 below.

$$\hat{g}_\Delta(k_x, k_y) \simeq i2\pi k_x \int\int \frac{2}{\gamma G_x} A(x,y)\Delta f(x,y)\times \quad \text{[Equation 9]}$$

$$e^{i2\pi(k_x x + k_y y)} dx dy$$

$$= \frac{2}{\gamma G_x}\mathcal{F}\left[\frac{\partial A(x,y)\Delta f(x,y)}{\partial x}\right]$$

Where $\mathcal{F}$ denotes a 2D Fourier transform.

With the same assumption for total variation (TV) based modeling, it can be easily seen that $\partial A(x,y)\Delta f(x,y)/\partial x$ is sparse because $A(x,y)\Delta f(x,y)$ is relatively smooth in most images. Even when the approximation of Equation 8 is not established, the correlation between the even and the odd images may be high because there is almost no difference between the even and the odd images. To understand its meaning, a finite number of collections of k-space sampling points to be identified may be set to $k_m=(k_x^{(m)},k_y^{(m)})$, $m=1, \ldots, M$, and the discrete k-space data may be defined as shown in Equation 10 below.

$$\hat{g}_\Delta = \hat{g}_+ - \hat{g}_-$$

$$\hat{g}_+ = [\hat{g}_+(k_1) \ldots \hat{g}_+(k_M)]^T$$

$$\hat{g}_- = [\hat{g}_-(k_1) \ldots \hat{g}_-(k_M)]^T \quad \text{[Equation 10]}$$

Where the superscript T may mean transpose.

Due to the sparsity, when a Hankel matrix $\mathbb{H}_d(\hat{g}\Delta)\in \mathbb{C}^{M\times d}$ is constructed from discrete k-space data $\hat{g}\Delta$, the Hankel matrix is low-ranked. Where d represents the matrix pencil size.

This means that the vector $h\in \mathbb{C}^d$ exists as shown in Equation 11 below, and that the rank of the concatenated Hankel matrix $[\mathbb{H}_d(\hat{g}_+)\,\mathbb{H}_d(\hat{g}_-)]\in \mathbb{C}^{M\times 2d}$ is low.

$$\mathbb{H}_d(\hat{g}_\Delta)h = (\mathbb{H}_d(\hat{g}_+) - \mathbb{H}_d(\hat{g}_-))h \quad \text{[Equation 11]}$$

$$= [\mathbb{H}_d(\hat{g}_+)\,\mathbb{H}_d(\hat{g}_-)]\begin{bmatrix}h \\ -h\end{bmatrix} = 0$$

Similarly, the Hankel matrix connected from a P parallel coil may be defined as in Equation 12 below.

$$\mathbb{H}_{d|2P}(\hat{G}) := [\mathbb{H}_d(\hat{g}_+^{(1)})\,\mathbb{H}_d(\hat{g}_-^{(1)}) \ldots \mathbb{H}_d(\hat{g}_+^{(P)})\,\mathbb{H}_d(\hat{g}_-^{(P)})]$$

with $\mathbb{H}_{d|2P}(\hat{G})\in \mathbb{C}^{M\times 2dP}$ and $$\hat{G} := [\hat{g}_+^{(1)}\,\hat{g}_-^{(1)} \ldots \hat{g}_+^{(P)}\,\hat{g}_-^{(P)}]\in \mathbb{C}^{M\times 2P} \quad \text{[Equation 12]}$$

Where the superscript may denote a coil index.

$\mathbb{H}_{d|2P}(\hat{G})$ is low ranked by the inter-coil annihilating filter relationship.

Thus, when a part of the k-space data is missing, the missing element may be recovered using the low rank Hankel matrix completion technique of Equation 13 below.

$$(MC)\min_{\hat{Z}\in C^{M\times 2P}} \text{Rank}\mathbb{H}_{d|2P}(\hat{Z}) \quad \text{[Equation 13]}$$

$$\text{subject to } \mathcal{P}_{\Lambda_e}[\hat{g}_+^{(i)}] = \mathcal{P}_{\Lambda_e}[\hat{z}_{2i-1}],$$

$$\mathcal{P}_{\Lambda_o}[\hat{g}_-^{(i)}] = \mathcal{P}_{\Lambda_o}[\hat{z}_{2i}], i = 1, \ldots, P$$

Where $\hat{Z}_i$ denotes the i-th row of $\hat{Z}$, $\Lambda_e$ and $\Lambda_o$ denotes a k-space index for even and odd phase encoding, and $\mathcal{P}_\Lambda$ denotes a projection to the sampled index $\Lambda$. After solving Equation 13, the inventive concept may obtain interpolated even- and odd-numbered virtual k-spatial data for each coil, and obtains the virtual even and odd images for each coil from the obtained data simply through an inverse Fourier transform. The final artifact corrected EPI data may then be obtained as the sum of squares.

The low rank Hankel matrix completion problem (MC) of Equation 13 may be solved in various ways, and ALOHA may use a matrix factorization technique. However, the main technical problem is the relatively high computational cost for matrix factorization. In the inventive concept, a deep learning method may solve this problem by completely performing data-based processing on the matrix factorization.

FIG. 1 is a flowchart of a method of removing ghost artifacts of an echo planar image according to an embodiment of the inventive concept.

As illustrated in FIG. 1, a method according to an embodiment of the inventive concept may receive an echo planar image and divide Fourier space data of the echo planar image, for example, k-space data, into even-numbered Fourier space data and odd-numbered Fourier space data (S110).

Here, in step S110, the echo planar image for each of the coils may be converted into k-space data, for example, the image space data is converted into Fourier space data through the Fourier transform, and the converted k-space data may be divided into even-numbered k-space data and odd-numbered k-space data.

The even-numbered k-space data and odd-numbered k-space data obtained through division in step S110 may be input to a neural network interpolating Fourier space, and the even-numbered k-space data and the odd-numbered k-space data with the Fourier space interpolated may be obtained using the neural network interpolating Fourier space (S120).

Here, the neural network in step S120 may include at least one of a neural network satisfying a low-rank Hankel matrix constraint, a neural network based on a convolution framelet, a neural network based on annihilating filter-based low-rank Hankel matrix approach (ALOHA) and deep convolution framelet, a multi-resolution neural network including a pooling layer and an unpooling layer, and a neural networks satisfying a preset frame condition. In this case, the multi-resolution neural network may include a bypass connection from the pooling layer to the unpooling layer.

When the even-numbered k-space data and the odd-numbered k-space data with the Fourier space interpolated are obtained in step S120, the echo planar image in which ghost artifacts are removed may be restored based on the even-numbered k-space data and the odd-numbered k-space data with the Fourier space interpolated (S130).

Here, in step S130, even-numbered image data and odd-numbered image data in which ghost artifacts are removed are obtained using inverse Fourier transform (IFT), and an echo planar image in which ghost artifacts are removed may be restored using the even-numbered image data and the odd-numbered image data obtained as described above.

The method according to the inventive concept will be described with reference to FIGS. 2 to 8.

Figure 2:
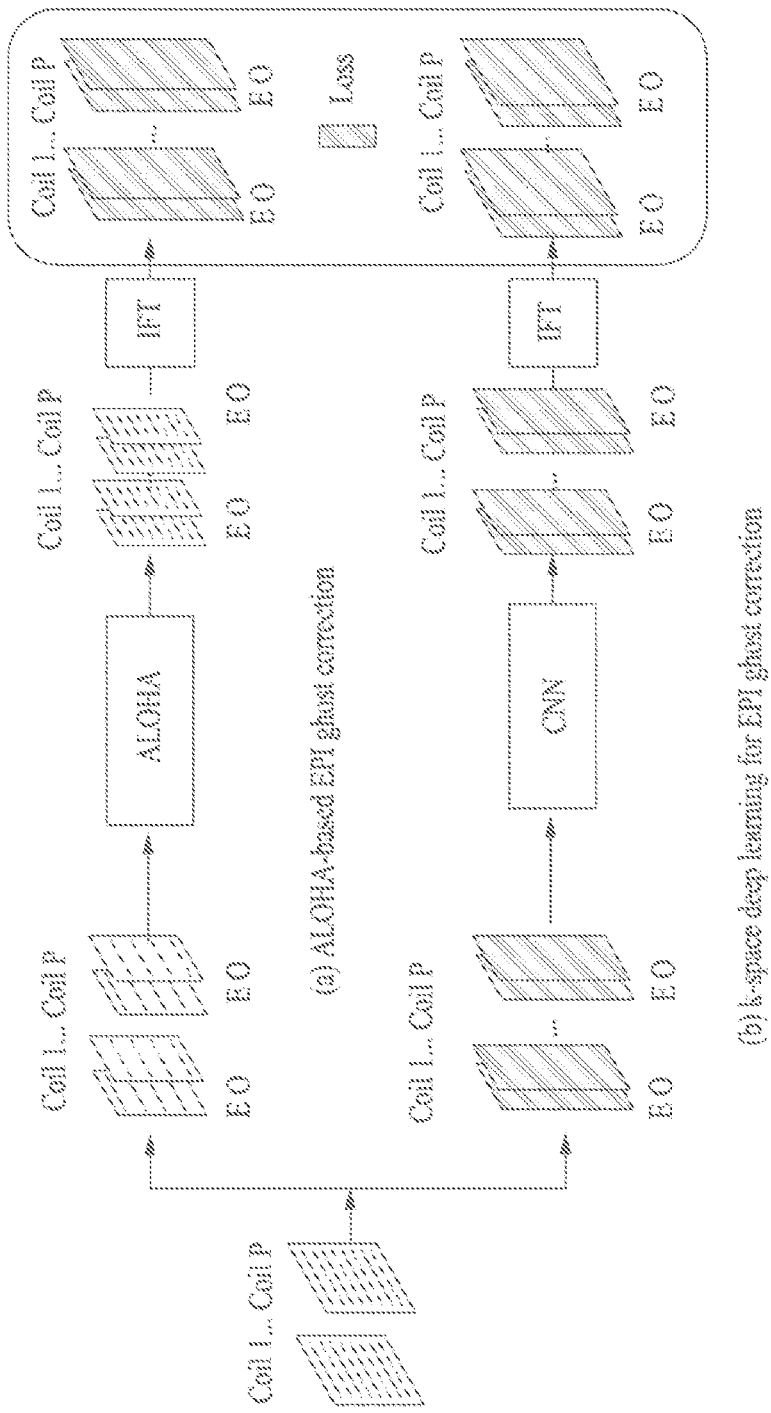
FIG. 2 illustrates a k-space learning based neural network structure according to the inventive concept.

FIG. 2 illustrates a k-space learning based neural network structure according to the inventive concept, and FIG. 2A illustrates an exemplary diagram for describing an ALOHA based ghost removal process, and FIG. 2B illustrates an exemplary diagram for describing k-space deep learning for ghost artifact removal. Here, E and O may refer to frames composed of even and odd k-space lines, respectively. After the interpolated even and odd virtual images are generated, the sum of square images are obtained as the final ghost corrected image. Here, IFT means inverse Fourier transform.

The inventive concept may use an image restored using the ALOHA technique as the ground truth because there is no ground truth data when removing ghost artifacts, and use the k-space of even and odd lines is used. Can be used as input data to match ALOHA based labels.

The inventive concept may use k-space in which even and odd lines are all filled for fast learning and convergence. The k-space is divided into real and imaginary values, it can be converted back to a complex value because the k-space has a complex value.

Deep Neural Network from ALOHA

Figure 3:
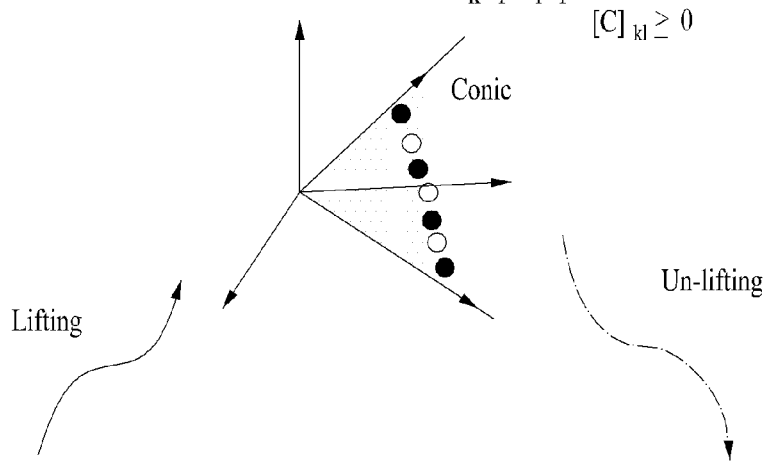
FIG. 3 illustrates the geometry of a single layer encoder-decoder network for k-space deep learning.
Figure 3:
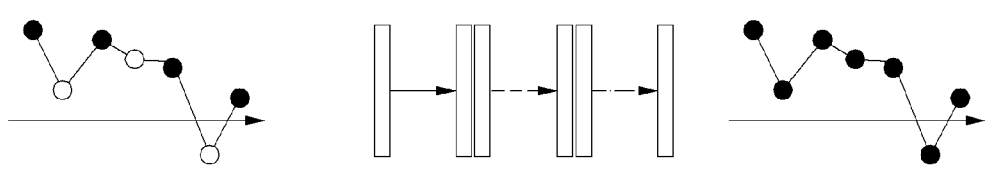

FIG. 3 illustrates geometry of a single-layer encoder-decoder network for k-space deep learning. A high dimensional structure of low-rank Hankel matrix decomposition, which is a key concept of ALOHA-based EPI ghost correction will be described below to facilitate understanding of the connection between ALOHA and deep neural networks.

The empty circle shown in FIG. 3 means missing k-space data, and by lifting to high-dimensional space, the missing k-space data may be interpolated.

More specifically, assuming that $\overline{Z} \in \mathbb{C}^{M \times 2P}$ is lifted to a rank-Q Hankel matrix $\mathbb{H}_{d|2P}(\hat{Z}) \in \mathbb{C}^{M \times 2dP}$, two sets of basis matrices $\Psi, \tilde{\Psi} \in \mathbb{R}^{2dP \times Q}$ and $\Phi, \tilde{\Phi} \in \mathbb{C}^{S \times M}$ may be found as in Equation 14 below.

$$\Psi \tilde{\Psi}^T = P_R, \Phi \tilde{\Phi}^T = I_M \quad \text{[Equation 14]}$$

Where T denotes a Hermitian transposition, $P_R$ denotes a projection matrix for the row subspace of $\mathbb{H}_{d|2P}(\hat{Z})$, and IM denotes an M×M identity matrix.

Using the above matrices, it can be easily seen that the Hankel matrix $H_{d|2P}(\hat{Z})$ has rank-Q factorization as shown in Equation 15 below.

$$\mathbb{H}_{d|2P}(\hat{Z}) = \tilde{\Phi}\Phi^T \mathbb{H}_{d|2P}(\hat{Z})\Psi\tilde{\Psi}^T = \tilde{\Phi}C\tilde{\Psi}^T \quad \text{[Equation 15]}$$

$$= \sum_{k=1}^{s} \sum_{l=1}^{Q} [C]_{kl} \tilde{B}^{kl}$$

Where the basis matrix $\tilde{B}^{kl}$ may be defined as in Equation 16 below.

$$\tilde{B}^{kl} = \tilde{\phi}_k \tilde{\psi}_l^T, k=1, \ldots, S, l=1, \ldots, Q \quad \text{[Equation 16]}$$

Where $\tilde{\phi}_k$ and $\tilde{\psi}_l$ may denote k-th and l-th rows of $\tilde{\Phi}$ and $\tilde{\Psi}$, respectively.

The expansion coefficient, also called the convolution framelet coefficient, may be given by Equation 17 below.

$$C := \Phi^T \mathbb{H}_{d|P}(\hat{Z})\Psi \in \mathbb{C}^{S \times Q} \quad \text{[Equation 17]}$$

Where $[C]_{kl}$ may denote the (k, l) element of C.

The main concept of ALOHA is to find the basis matrix $\tilde{B}^{kl}$ such that $\hat{Z}$ is a feasible solution to Equation 13. That is, the basis matrix $\tilde{B}^{kl}$ may be obtained when $\mathbb{H}_{d|2P}(\hat{Z})$ for a possible solution $\hat{Z}$ is within the range of these bases.

When the basis matrix $\tilde{B}^{kl}$ is obtained the offline training data, ALOHA may be extended to the neural network. In this case, unlike the original ALOHA, where the basis is obtained from measurement data, the neural network needs to learn the basis based on separate training data, so in the inventive concept, some constraints to prevent the learned base from being arbitrary may be required. In particular, the inventive concept may have a positivity constraint such as Equation 18 below for the expansion coefficient.

$$[C]_{kl} \geq 0, \forall k, l \quad \text{[Equation 18]}$$

Because it is a non-negativity constraint, the training data needs to be in the conical hull of the base as shown in FIG. 2, so the learned base may not be very different from the training data. These learned bases are represented as representation of each of parts which are the key ingredient for non-negative matrix factorization (NMF).

One of the most important in the theory of deep convolution framelet is that when high-dimensional Hankel matrix factorization is un-lifted into the original signal space, it becomes a neural network with an encoder-decoder architecture. More specifically, by applying the generalized inverse of the Hankel matrix, Equation 15 may be expressed in the original space as shown in Equation 19 below.

$$\hat{Z} = (\tilde{\Phi}C) \circledast \mathcal{G}(\tilde{\Psi}) \quad \text{[Equation 19]}$$

Where $\circledast$ denotes convolution, $\mathcal{G}(\tilde{\Psi})$ denotes a multi-channel filter obtained by the rearrangement factor of $\tilde{\Psi}$. Similarly, Equation 17 may be expressed by Equation 20 below by another convolution.

$$C = \Phi^T(\hat{Z} \circledast) \mathcal{H}(\Psi) \quad \text{[Equation 20]}$$

Where $\mathcal{H}(\Psi)$ may denote a multi-channel filter obtained by rearranging of $\Psi$.

In addition, Equation 18 may be implemented using a rectified linear unit (ReLU), and $\Psi^T$ and $\tilde{\Psi}$ in Equation 20 and Equation 19 may be identified by generalized pooling and unpooling operations. Thus, Equations 20 and 19 for Equation 18 may be a single layer CNN with an encoder-decoder architecture as shown in FIG. 2. This concept may be extended to a multi-layer deep convolution framelet when the encoder and decoder convolution filters $\mathcal{H}(\Psi)$ and $\mathcal{G}(\tilde{\Psi})$ may be represented by cascaded convolution of small length filters.

Image Domain Loss

In k-space deep learning for accelerated MRI, a network is implemented in the k-space domain, but image domain loss is minimized. Despite this hybrid architecture, gradients may be easily calculated because the adjoint of the Fourier transform corresponds to an inverse Fourier transform that may be easily implemented using the fast Fourier transform (FFT). Therefore, in the inventive concept, by using the same concept as k-space deep learning in the inventive concept, ghost-corrected images are used as label data for lossy network training, and the network may be implemented in k-space.

However, it may need to take into account in implementation because the input k-space data is virtual even-numbered and odd-numbered k-space data. Accordingly, the inventive concept may provide a reconstructed image from interpolated virtual k-space data as a label. The inventive concept may use a result of reconstruction of interpolated k-space data as a label because ALOHA-based ghost correction is able to interpolate virtual even-numbered and odd-numbered k-data. In particular, as illustrated in FIGS. 1A and 1B, even and odd virtual images are generated using ALOHA for each coil from the even and odd k-space lines, and these even and odd complex images for each coil may be used as label data.

Raw data may be collected for eight healthy subjects by a 7T full-body scanner using a 32-channel phase array RF coil, and acquisition parameters may be TR/TE=3000/24 ms, flip angle=90 degrees, Field of view (FOV)=192×192 mm2, voxel size=2.7×2.7 mm 2, and slice thickness=2.7 mm. Gradient-recalled echo EPI (GREEPI) sequences may be used, and the acquired data may consist of 40 slices and 60 time frames. Pre-scan data for a typical ghost correction method may be collected before acquisition of full data. The pre-scan data may be acquired for all PE lines, slices and coils without phase encoding blip, and a phase difference may be calculated by subtracting the phase of a single PE line from the phase of an adjacent PE line. Phase disparity of images may be compensated by the calculated phase difference map, and a reference-free ghost correction algorithm may be implemented. In the reference-free ghost correction algorithm, the phase disparity may be calculated from the x-ky domain raw data by assuming that the disparity is linear along a reading direction.

The overall reconstruction flow of the k-space deep learning-based ghost correction method of the inventive concept is illustrated in FIG. 2B. In particular, the P-channel multi-coil k-space data may be divided into even and odd channels. Even- and odd-numbered k-space data may be processed using a convolution neural network, the output of which is even- and odd-numbered k-space data interpolated for each coil. An inverse Fourier transform is applied to obtain virtual even and odd images in which ghost is corrected. Finally, a square sum image may be generated from even and odd images of multiple channels, similarly to ALOHA. This process may be identical to the ALOHA-based ghost correction algorithm of FIG. 2A, except for k-space interpolation. In particular, k-space interpolation may be performed using ALOHA in the case of FIG. 2A, while k-space interpolation may be performed using CNN in the case of FIG. 2B. Another minor difference is that ALOHA uses zero-padded even- and odd-numbered k-space data as inputs, while in the method of the inventive concept, the missed k-space lines are extended to another phase k-space data so that network training is converged more quickly.

Figure 4:
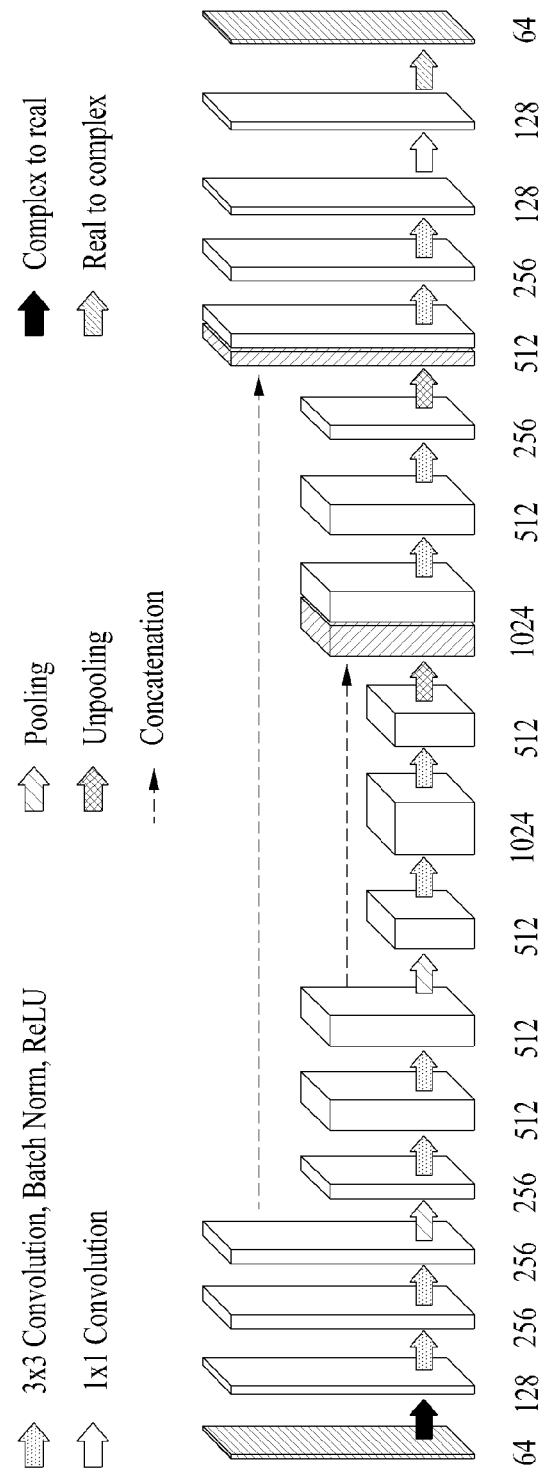
FIG. 4 illustrates a multi-scale neural network structure used in the method of the inventive concept.

FIG. 4 illustrates a multi-scale neural network structure used in the method of the inventive concept. As illustrated in FIG. 4, the neural network structure may follow a U-Net structure and may include a convolution layer that performs linear transform operations, a batch normalization layer that performs normalization operations, a rectified linear unit (ReLU) layer that performs nonlinear function operations, and contracting path connection with concatenation. Each stage may include convolution with 3×3 kernels, batch normalization and ReLU layers as basic operators. After each pooling layer, the number of channels may be doubled, and the size of the layers may be reduced by four times. Here, the pooling layer may be a 2×2 average pooling layer, the unpooling layer may be a 2×2 average unpooling layer, and the pooling layer and the unpooling layer may be located between the stages. The neural network may also include a bypass connection from the pooling layer to the unpooling layer. Some of intermediate images of an encoding process may be connected with unpooled pictures (concatenation). The last layer in the network may be a convolution layer (1×1 Cony) with a 1×1 kernel. The number of channels for each convolution layer may be shown in FIG. 4. The k-space data may be divided into real and imaginary channels and then provided as inputs of a U-net backbone because the input k-space data and the output image data are complex values. Thus, the number of channels is doubled because the real and imaginary values of the k-space data are separated and chains them through a channel direction. Similarly, real and imaginary value channels are coupled at an output of a network to obtain k-space data of complex-values.

As described above, the inventive concept may use ALOHA-based ghost correction image as a label. However, in high-field MRI, ALOHA-based correction algorithms do not remove ghost artifacts in some frames. Thus, the inventive concept may visually inspect the ALOHA-based ghost correction results and select and use ghost corrected k-space data which exists as labels. In addition, the trained neural network of the inventive concept may successfully correct ghost artifacts even when ALOHA fails.

Neural networks may be implemented using the Mat-ConvNet toolbox in an MATLAB 2015a environment. For example, a neural network may be implemented using a GTX 1080-Ti graphics processor and an i7-4770 CPU (3.40 GHz). The weight of the convolution layer may be initialized by a Gaussian random distribution using an Xavier method to obtain an appropriate scale, which may prevent the signal from being exploded or disappearing in the early stages of learning. The inventive concept may train weights of a neural network using stochastic gradient descent (SGD), for example, stochastic gradient descent with momentum to minimize loss functions. In training, the number of epochs to prevent overfitting may be 30 and the size of the mini batch may be four. The learning rate may be an initial learning rate of 10-5, which gradually drops to 10-6. The regularization parameter to prevent weights from becoming too large is 10-4. In addition, the inventive concept uses loss of image domain data for training, and the training time may be 2.5 hours.

To identify the benefits of k-space learning over image learning, the same network architecture of FIG. 3 may be used for image domain learning. In this case, the input data is even and odd virtual images degraded by ghost artifacts, not k-space data, and the training goal is to learn the relationship between these input images and output ghost corrected virtual images. The same training procedure described above may be used for image domain learning.

Figure 5:
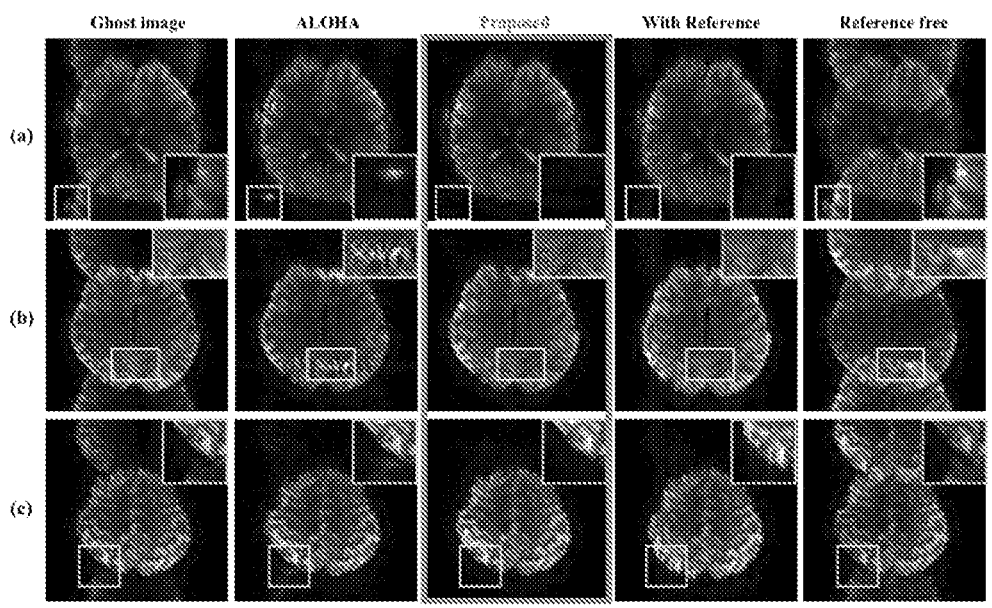
FIG. 5 illustrates an example of comparing the ghost correction results by the method according to the inventive concept and a conventional method.
Figure 6:
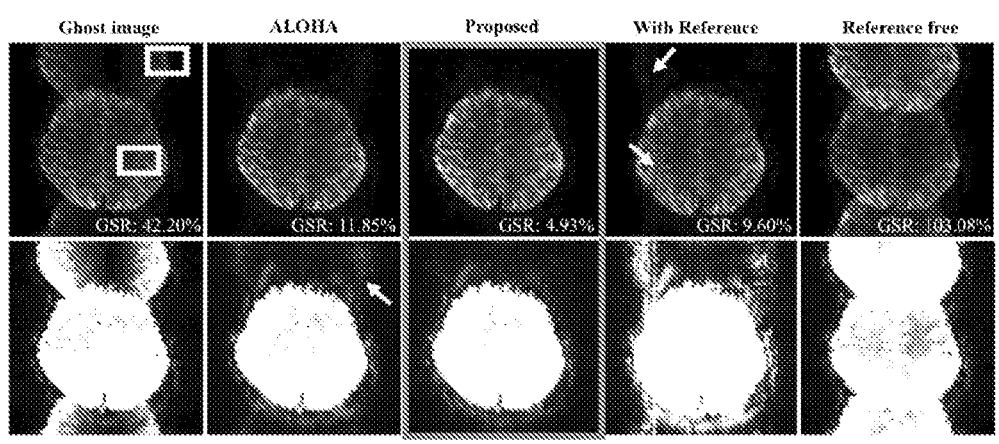
FIG. 6 illustrates an example of the result of the quantitative comparison between the method according to the inventive concept and the conventional method.

FIG. 5 shows an exemplary view comparing ghost correction results by a method according to the inventive concept and a conventional method, FIG. 6 shows an exemplary view of the quantitative comparison results of the method according to the inventive concept and the conventional method, which illustrates comparison of results obtained by applying a neural network scheme to 7T MR EPI data.

As illustrated in FIGS. 5 and 6, it can be seen that the best results are obtained in the method according to the inventive concept, and in the ALOHA or reference image-based removal method, ghost artifacts remain or other artifacts such as linear artifacts occur. For example, it can be seen that the artifact still remains at the position indicated by the arrow in the conventional method shown in FIG. 6. In addition, as shown in FIG. 6, it can be seen that the GSR (ghost to signal ration) value for measuring the signal ratio of ghost and an actual measurement target region is the best in the method according to the inventive concept.

Figure 7:
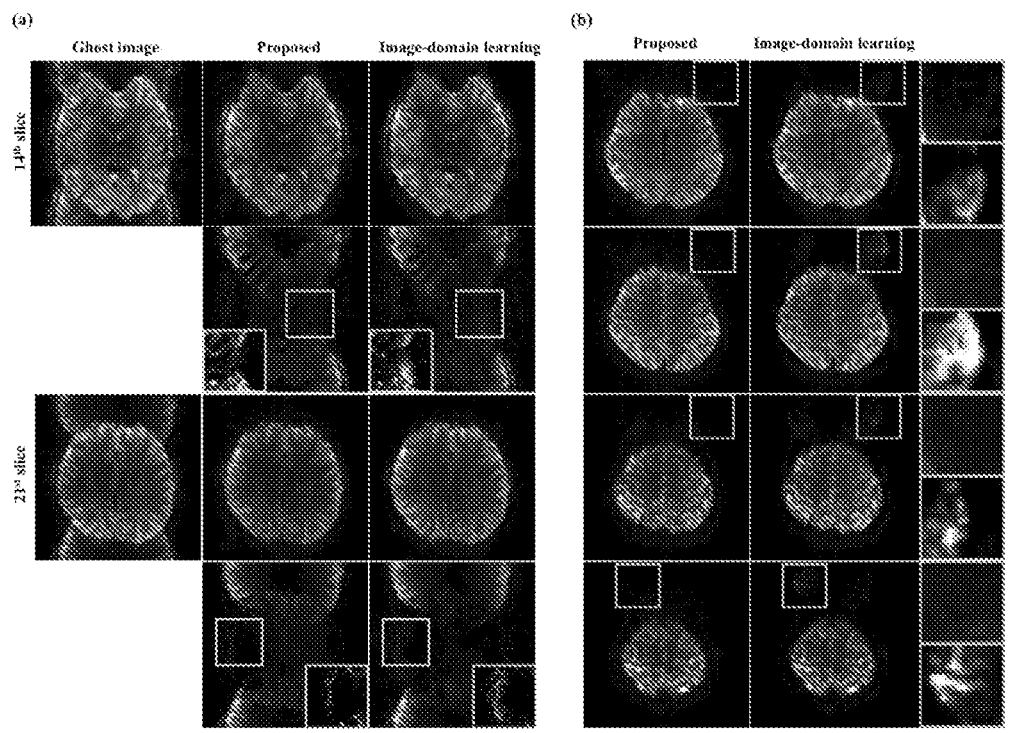
FIG. 7 illustrates an example of comparing image domain learning.

FIG. 7 illustrates an example of comparing image domain learning, and illustrates an example of comparing a method of the inventive concept for performing learning in k-space with conventional methods for performing learning in image space.

As illustrated in FIG. 7, it can be seen that in the case of learning in image space, the ghost artifacts remain in a state of not cleanly being removed or the structure of a region to be measured is lost, while in the method of the inventive concept, the ghost artifacts are cleanly removed and appear similar to the actual measurement results.

Figure 8:
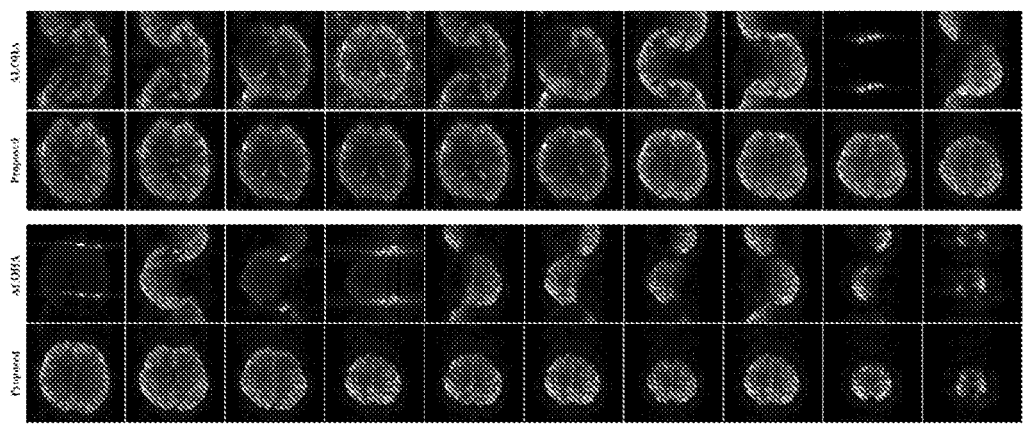
FIG. 8 illustrates an example of comparing ghost artifact removal results by the method according to the inventive concept and ALOHA.

FIG. 8 illustrates an example of comparing the ghost artifact removal result by the method according to the inventive concept with ghost artifact removal result by ALOHA. As illustrated in FIG. 8, the method according to the inventive concept effectively removes ghost artifacts as compared to the conventional methods. It can be seen that the removal, and it can also be seen that, due to the high magnetic field non-uniformity of the 7T MR, images are not properly restored in the ALOHA technique but the artifacts are removed without problems by the inventive concept.

As described above, the method according to the embodiment of the inventive concept may stably remove ghost artifacts of the echo planar image even when the nonuniformity the magnetic field is large by using a neural network.

In addition, the method according to the embodiment of the inventive concept may remove ghost artifacts of the echo planar image by correcting k-space phase disparity without a reference scan using a neural network interpolating Fourier space, thus improving the image quality and reducing calculation time as compared to conventional methods.

Figure 9:
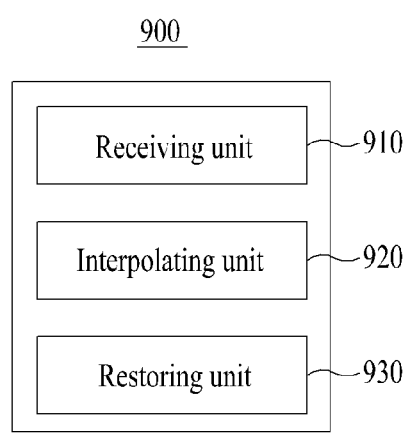
FIG. 9 illustrates a configuration of an apparatus for removing ghost artifacts of an echo planar image according to an embodiment of the inventive concept.

FIG. 9 illustrates a configuration of an apparatus for removing ghost artifacts of an echo planar image according to an embodiment of the inventive concept, and illustrates a configuration of an apparatus for performing the methods of FIGS. 1 to 8.

Referring to FIG. 9, an apparatus for removing ghost artifacts of an echo planar image according to an embodiment of the inventive concept may include a receiving unit 910, an interpolating unit 920, and a restoring unit 930.

The receiving unit 900 may receive Fourier space data of an echo planar image.

Here, the receiving unit 900 may receive an echo planar image, convert the echo planar image into Fourier space data through Fourier transform, and divide the transformed Fourier space data into odd-numbered Fourier space data and even-numbered Fourier space data.

Of course, the receiving unit 900 may divide Fourier space data into odd-numbered Fourier space data and even-numbered Fourier space data, with respect to an echo planar image of each coil.

The interpolating unit 920 may interpolate even-numbered k-space data and odd-numbered k-space data using a neural network interpolating Fourier space to obtain even-numbered k-space data and odd-numbered k-space data with Fourier space interpolated.

Here, the interpolating unit 920 may obtain the even-numbered k-space data and odd-numbered k-space data with Fourier space interpolated by interpolating the even-numbered k-space data and the odd-numbered k-space data using at least one of a neural network satisfying a low-rank Hankel matrix constraint, a neural network based on a convolution framelet, a neural network based on annihilating filter-based low-rank Hankel matrix approach (ALOHA) and deep convolution framelet, a multi-resolution neural network including a pooling layer and an unpooling layer, and a neural networks satisfying a preset frame condition. In this case, the multi-resolution neural network may include a bypass connection from the pooling layer to the unpooling layer.

The restoring unit 930 may restore an echo planar image in which ghost artifacts are removed based on the even-numbered k-space data and odd-numbered k-space data of which the Fourier space is interpolated.

In this case, the restoring unit 930 may obtain the even-numbered image data and odd-numbered image data in which ghost artifacts are removed using inverse Fourier transform (IFT), and restore an echo planar image in which ghost artifacts are removed using the even-numbered image data and the odd-numbered image data obtained.

Although the description of the apparatus of FIG. 9 is omitted, the components of FIG. 9 may include all the contents described with reference to FIGS. 1 to 8, which are obvious to those skilled in the art.

According to embodiments of the inventive concept, even when the magnetic field nonuniformity is large by using a neural network, it is possible to stably remove ghost artifacts of the echo planar image.

According to embodiments of the inventive concept, by using a neural network interpolating Fourier space, by correcting k-space phase mismatch without a reference scan, it is possible to remove the ghost artifact of the echo-plane image, which is compared to the conventional method Improve quality and reduce computation time.

The inventive concept may be applied to various imaging fields requiring removal of artifacts, for example, MRI including functional MRI (fMRI), diffusion MRI (diffusion MRI), and the like, as well as imaging. It can be easily applied to any video field where ghost artifacts inevitably occur.

The apparatus described above may be implemented as a hardware component, a software component, and/or a combination of hardware components and software components. The above-described apparatuses may be implemented by hardware components, software components, and/or any combination thereof. For example, the apparatuses and components described in the embodiments may be implemented by using processors, arithmetic logic units (ALUs), digital signal processors, microcomputers, field programmable arrays (FPAs), programmable logic units (PLUs), microprocessors, one or more general-purpose computers or special-purpose computers, or any other devices that may execute and respond to instructions. The processing apparatus may execute an operating system (OS) and one or more software applications executed in the OS. Also, the processing apparatus may access, store, operate, process, and generate data in response to the execution of software. For convenience of understanding, it may be described that one processing apparatus is used. However, those or ordinary skill in the art will understand that the processing apparatus may include a plurality of processing elements and/or various types of processing elements. For example, the processing apparatus may include a plurality of processors or a processor and a controller. Also, the processing apparatus may include any other processing configurations such as parallel processors.

The software may include computer programs, codes, instructions, or any combination thereof, and may construct the processing apparatus for desired operations or may independently or collectively command the processing apparatus. In order to be interpreted by the processing apparatus or to provide commands or data to the processing apparatus, the software and/or data may be permanently or temporarily embodied in any types of machines, components, physical devices, virtual equipment, computer storage mediums, or transmitted signal waves. The software may be distributed over network coupled computer systems so that it may be stored and executed in a distributed fashion. The software and data may be stored in one or more computer-readable recording mediums.

The methods according to the embodiments may be embodied in the form of program commands executable through various computer processes, which may be recorded on a computer-readable recording medium. The computer-readable recording medium may include program commands, data files, and data structures either alone or in combination. The program commands recorded on the computer-readable recording medium may be those that are especially designed and configured for the embodiments, or may be those that are known and available to computer programmers skilled in the art. Examples of the computer-readable recording medium include magnetic recording media such as hard disks, floppy disks and magnetic tapes, optical recording media such as CD-ROMs and DVDs, magneto-optical recording media such as floptical disks, and hardware devices such as ROMs, RAMs and flash memories that are especially configured to store and execute program commands. Examples of the program commands include machine language codes that may be generated by a compiler, and high-level language codes that may be executed by a computer by using an interpreter.

Although the embodiments have been described with reference to the accompanying drawings, those of ordinary skill in the art will understand that various changes and modifications may be made therein. For example, the relevant results may be achieved even when the described technologies are performed in a different order than the described methods, and/or even when the described components such as systems, structures, devices, and circuits are coupled or combined in a different form than the described methods or are replaced or substituted by other components or equivalents.

Therefore, other implementations, other embodiments, and equivalents to the claims are also within the scope of the following claims.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An image processing method comprising:
receiving Fourier space data of an echo planar image; and
restoring the echo planar image in which ghost artifacts are removed using a neural network, wherein the neural network includes a neural network based on annihilating filter-based low-rank Hankel matrix approach (ALOHA) and deep convolution framelet.

2. An image processing method, comprising:
receiving Fourier spaced data of an echo planar image; and
restoring the echo planar image in which ghost artifacts are removed using a neural network, wherein the neural network includes a multi-resolution neural network including a pooling layer and an unpooling layer.

3. An image processing apparatus comprising:
a receiving unit configured to receive Fourier space data of an echo planar image; and
a restoring unit configured to restore the echo planar image in which ghost artifacts are removed using a neural network interpolating Fourier space, wherein the neural network includes a neural network based on annihilating filter-based low-rank Hankel matrix approach (ALOHA) and deep convolution framelet.

4. An image processing apparatus comprising:
a receiving unit configured to receive Fourier space data of an echo planar image; and
a restoring unit configured to restore the echo planar image in which ghost artifacts are removed using a neural network interpolating Fourier space, wherein the neural network includes a multi-resolution neural network including a pooling layer and an unpooling layer.

5. The image processing method of claim 1, wherein the receiving of the Fourier space data includes dividing the Fourier space data into the odd-numbered Fourier space data and even-numbered Fourier space data, and
wherein the restoring of the echo planar image includes obtaining the odd-numbered Fourier space data and even-numbered Fourier space data with the Fourier space interpolated using the neural network and restoring the echo planar image in which the ghost artifacts are removed based on the odd-numbered Fourier space data and even-numbered Fourier space data with the Fourier space interpolated.

6. The image processing method of claim 1, wherein the restoring of the echo planar image includes restoring the echo planar image in which the ghost artifacts are removed using the neural network satisfying a predetermined low-rank Hankel matrix constraint.

7. The image processing method of claim 1, wherein the neural network includes a neural network based on convolution framelet.

8. The image processing method of claim 2, wherein the neural network includes a bypass connection from the pooling layer to the unpooling layer.

9. The image processing apparatus of claim 3, wherein the receiving unit divides the Fourier space data into odd-numbered Fourier space data and even-numbered Fourier space data, and wherein the restoring unit obtains the odd-numbered Fourier space data and even-numbered Fourier space data with the Fourier space interpolated using the neural network and restores the echo planar image in which the ghost artifacts are removed based on the odd-numbered Fourier space data and even-numbered Fourier space data with the Fourier space interpolated.

10. The image processing apparatus of claim 3, wherein the restoring unit removes ghost artifacts of the echo planar image using a neural network satisfying a predetermined low-rank Hankel matrix constraint.

11. The image processing apparatus of claim 3, wherein the neural network includes a neural network based on convolution framelet.

12. The image processing apparatus of claim 4, wherein the neural network includes a bypass connection from the pooling layer to the unpooling layer.

* * * * *